US009161466B2

(12) United States Patent
Huang

(10) Patent No.: US 9,161,466 B2
(45) Date of Patent: Oct. 13, 2015

(54) HOLDING MODULE

(71) Applicant: Ming-Hsien Huang, New Taipei (TW)

(72) Inventor: Ming-Hsien Huang, New Taipei (TW)

(*) Notice: Subject to any disclaimer, the term of this patent is extended or adjusted under 35 U.S.C. 154(b) by 113 days.

(21) Appl. No.: 14/067,957

(22) Filed: Oct. 31, 2013

(65) Prior Publication Data

US 2015/0060624 A1 Mar. 5, 2015

(30) Foreign Application Priority Data

Sep. 2, 2013 (TW) .............................. 102216464 U

(51) Int. Cl.
| | |
|---|---|
| *E05B 73/00* | (2006.01) |
| *B60R 11/02* | (2006.01) |
| *F16M 11/04* | (2006.01) |
| *F16M 13/00* | (2006.01) |
| *H05K 5/02* | (2006.01) |
| *F16M 11/10* | (2006.01) |
| *A47F 7/024* | (2006.01) |
| *B60R 11/00* | (2006.01) |

(52) U.S. Cl.
CPC ............ *H05K 5/0204* (2013.01); *A47F 7/0246* (2013.01); *B60R 11/0241* (2013.01); *E05B 73/0082* (2013.01); *F16M 11/041* (2013.01); *F16M 11/105* (2013.01); *F16M 13/00* (2013.01); *H05K 5/0208* (2013.01); *B60R 2011/0071* (2013.01); *F16M 2200/02* (2013.01)

(58) Field of Classification Search
CPC .. F16M 11/041; F16M 13/00; B60R 11/0241; B60R 2011/0071; H04M 1/04; E05B 73/0082
See application file for complete search history.

(56) References Cited

U.S. PATENT DOCUMENTS

| | | | | |
|---|---|---|---|---|
| 5,788,202 A | * | 8/1998 | Richter | 248/316.4 |
| 7,967,269 B2 | * | 6/2011 | Liu | 248/287.1 |
| 8,567,737 B2 | * | 10/2013 | Chen | 248/316.2 |
| 8,985,333 B1 | * | 3/2015 | Clementi | 206/476 |
| 2002/0191782 A1 | | 12/2002 | Beger et al. | |
| 2005/0236536 A1 | * | 10/2005 | Fan | 248/176.3 |
| 2006/0215836 A1 | * | 9/2006 | Wang | 379/455 |
| 2006/0278788 A1 | * | 12/2006 | Fan | 248/309.1 |
| 2007/0262223 A1 | * | 11/2007 | Wang et al. | 248/346.07 |
| 2007/0284500 A1 | * | 12/2007 | Fan | 248/346.06 |
| 2010/0051771 A1 | * | 3/2010 | Huang | 248/289.11 |
| 2012/0025035 A1 | * | 2/2012 | Huang | 248/122.1 |
| 2012/0312936 A1 | * | 12/2012 | Huang | 248/122.1 |
| 2013/0148273 A1 | * | 6/2013 | Tsai | 361/679.01 |
| 2013/0240587 A1 | * | 9/2013 | Buchhalter | 224/570 |
| 2013/0277520 A1 | * | 10/2013 | Funk et al. | 248/274.1 |
| 2013/0301216 A1 | * | 11/2013 | Trinh et al. | 361/679.58 |
| 2014/0092531 A1 | * | 4/2014 | Trinh et al. | 361/679.01 |
| 2014/0246551 A1 | * | 9/2014 | Springer et al. | 248/276.1 |

(Continued)

*Primary Examiner* — Ryan Kwiecinski
(74) *Attorney, Agent, or Firm* — Jianq Chyun IP Office

(57) ABSTRACT

A holding module includes a body, two first holding members and a first rotating member is provided. The two first holding members are adjustably disposed at two opposite sides of the body along a first direction, and each first holding member includes a first clamping part and a first groove along a second direction. A nonzero angle is included between the first direction and the second direction. The first rotating member is pivotally disposed at the body and includes two separating first protrusions which are respectively protruding to the corresponding first grooves. When moving one of the first holding members, the corresponding first groove drives the first protrusion to rotate the first rotating member, in the meantime, the other first protrusion is driven to push the other first holding member, such that the two champing parts are close to or away from each other.

19 Claims, 16 Drawing Sheets

(56) References Cited

U.S. PATENT DOCUMENTS

2014/0263931 A1* 9/2014 Chen .............................. 248/576
2015/0055278 A1* 2/2015 Baschnagel .............. 361/679.01
2015/0075356 A1* 3/2015 Liu et al. ........................ 84/625
2015/0196140 A1* 7/2015 Lin ............................... 248/551

\* cited by examiner

HOLDING MODULE

CROSS-REFERENCE TO RELATED APPLICATION

This application claims the priority benefit of Taiwan application serial no. 102216464, filed on Sep. 2, 2013. The entirety of the above-mentioned patent application is hereby incorporated by reference herein and made a part of this specification.

BACKGROUND

1. Field of the Invention

The invention is directed to a holding module and more particularly, to a holding module suitable for holding an electronic apparatus.

2. Description of Related Art

FIG. 1 is a perspective schematic diagram of a conventional holding module. With reference to FIG. 1, a conventional holding module 1 includes two opposite holding members 2 and 2', a main gear 3 and two sub gears 4 and 4'. The two holding members 2 and 2' may move relatively to hold and fix an electronic apparatus. The two holding members 2 and 2' respectively include racks 2a and 2a'. The racks 2a and 2a' are respectively engaged with the corresponding sub gear 4 and 4', and the two sub gears 4 and 4' are engaged with the main gear 3.

When the holding member 2 moves away from the holding member 2' (i.e., to the right), the rack 2a of the holding member 2 drives the corresponding sub gear 4 to rotate the main gear 3, and the other sub gear 4' is also rotated due to being linked with the main gear 3 so as to drive the holding member 2' to move to the left, such that the two holding members 2 and 2' depart away from each other by operating one of them. Likewise, to approach the two holding member 2 and 2', only one of the holding members 2 and 2' is moved toward the other holding member 2' or 2. Through the racks 2a and 2a' and the sub gears 4 and 4' operated with the main gear 3, the other one of the holding members 2 and 2' draws near.

SUMMARY

The invention is directed to a holding module capable of quickly and stably fixing an object, such as an electronic apparatus.

The invention is directed to a holding module including a body, two first holding members and a first rotating member. The two first holding members is retractably disposed at two opposite sides of the body along a first direction, and each of the two first holding members includes a first clamping part and a first groove along a second direction. A nonzero angle is included between the first direction and the second direction. The first rotating member is rotatably disposed at the body and includes two first protrusions separating from each other. Each of the first protrusions protrudes to the corresponding first groove. When one of the first holding members is moved, the corresponding first groove of the one of the first holding members drives one of the first protrusions to rotate the first rotating member and synchronically drives the other first protrusion to push the other first holding member, such that the two first clamping parts approach or depart away from each other.

In an embodiment of the invention, the holding module further includes a stopper member movably disposed in the body, located at a side of the first rotating member and adapted to contacting or departing away from the first rotating member. When the stopper member contacts the first rotating member, the first rotating member is incapable of rotating.

In an embodiment of the invention, the stopper member includes a switching part and a fixing part connected with each other, and the body has a first casing including a through slot, wherein the fixing part is located in the first casing, the switching part passes through the through slot and exposes to outside of the first casing, and the through slot extends a long a direction perpendicular to the protruding direction of the switching part, and the switching part is adapted to move along the through slot, such that the fixing part contacts or departs away from the first rotating member.

In an embodiment of the invention, the holding module further includes a swiveling member disposed in the first casing and near the fixing part, and including a limiting hook capable of being turned to stay on a moving path of the switching part so as to retain a relative position of switching part in the through slot.

In an embodiment of the invention, the holding module further includes a lock unit including a lock core linked with the swiveling member in the body, wherein the first casing has a through hole, the lock unit is disposed partly into a through hole. When the lock core is turned, the limiting hook of the swiveling member switches between a locked position and an unlocked position.

In an embodiment of the invention, the first rotating member includes a side surface, the stopper member includes a contact surface, and the stopper member contacts the first rotating member with the contact surface in the locked position.

In an embodiment of the invention, the side surface of the first rotating member and the contact surface of the stopper member correspondingly include sawteeth.

In an embodiment of the invention, the first direction is perpendicular to the second direction.

In an embodiment of the invention, the first rotating member comprises a disc.

In an embodiment of the invention, the first rotating member includes a connecting part rotatably disposed to the body and two fan-shaped parts respectively extending outward from the connecting part, wherein the two first protrusions are located on the two fan-shaped parts and a connection line of the two first protrusions passes through the connecting part.

In an embodiment of the invention, each of the first holding members further includes a second groove along the first direction, and the body comprises a first casing having two first pillars respectively protruding to the second grooves.

In an embodiment of the invention, the body includes a second casing. The second casing includes two first rails along the first direction, and the two first holding members are respectively disposed at the two first rails.

In an embodiment of the invention, the holding module further includes two second holding members and a second rotating member. The two second holding members are retractably disposed at two opposite sides of the body along a third direction. Each of the two second holding members includes a second clamping part and a third groove along a fourth direction. The second rotating member is rotatably disposed to the body, adjacent to a side of the first rotating member that is away from the first protrusions and includes two third protrusions protruding toward a direction that is away from the first rotating member. The third protrusions respective protrudes to the corresponding third grooves.

In an embodiment of the invention, each of the second holding members further includes a fourth groove along the third direction, and the body includes a first casing. The first casing has two second pillars respectively protruding to the fourth grooves.

In an embodiment of the invention, the body includes a second casing. The second casing has two second rails along the third direction, and the second holding members are respectively disposed at the two second rails.

In an embodiment of the invention, the stopper member includes a switching part and a fixing part connected with each other, and the body has a first casing, the first casing includes a through slot, the fixing part is located in the first casing, wherein the switching part passes through the through slot and exposes to outside of the first casing, the through slot extends along a third direction that is perpendicular to the protruding direction of the switching part, and the switching part is adapted to move along the through slot, such that the fixing part simultaneously contacts or departs away from the first rotating member and the second rotating member.

Based on the above, the holding module of the invention can hold an object, such as an electronic apparatus, using the two first holding members and the two second holding members which respectively extend and retract along different directions. The two first holding members are respectively linked with the first grooves through the first protrusions of the first rotating member, and the two second holding members are respectively linked with the third grooves through the second protrusions of the second rotating member, such that by moving one of the first holding members and one of the second holding members, the other first holding member and the other second holding member can be synchronously driven, respectively. Additionally, the user can limit the rotation of the first rotating member and the second rotating member through adjusting the position of the stopper member so as to fix the relative positions of the two first holding members and the relative positions of the two second holding members. Moreover, in the holding module of the invention, with the use of the lock core of the lock unit linked with the swiveling member in the body, the limiting hook of the swiveling member is turned to the moving path of the stopper member to limit the movement of the stopper member. By doing so, the object located in the two first holding members and the two second holding members can be effectively prevented from being accidentally taken away by others.

In order to make the aforementioned and other features and advantages of the present invention more comprehensible, several embodiments accompanied with figures are described in detail below.

BRIEF DESCRIPTION OF THE DRAWINGS

The accompanying drawings are included to provide a further understanding of the present invention, and are incorporated in and constitute a part of this specification. The drawings illustrate embodiments of the present invention and, together with the description, serve to explain the principles of the present invention.

DESCRIPTION OF EMBODIMENTS

Figure 1:
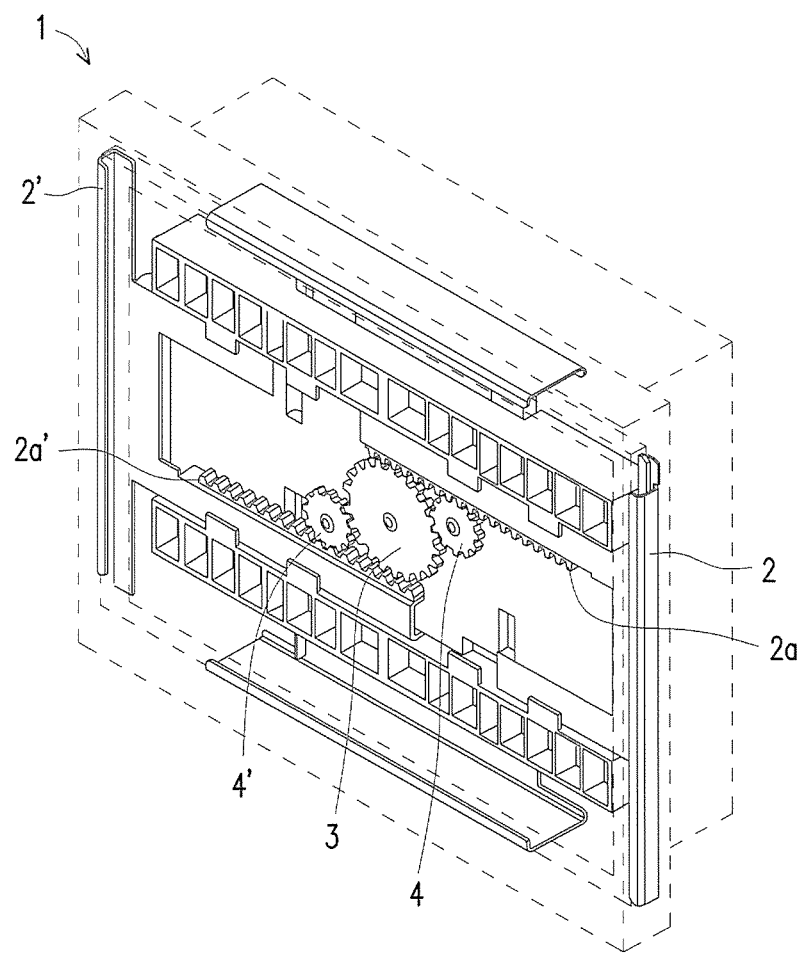
FIG. 1 is a schematic diagram of a conventional holding module.
Figure 2A:
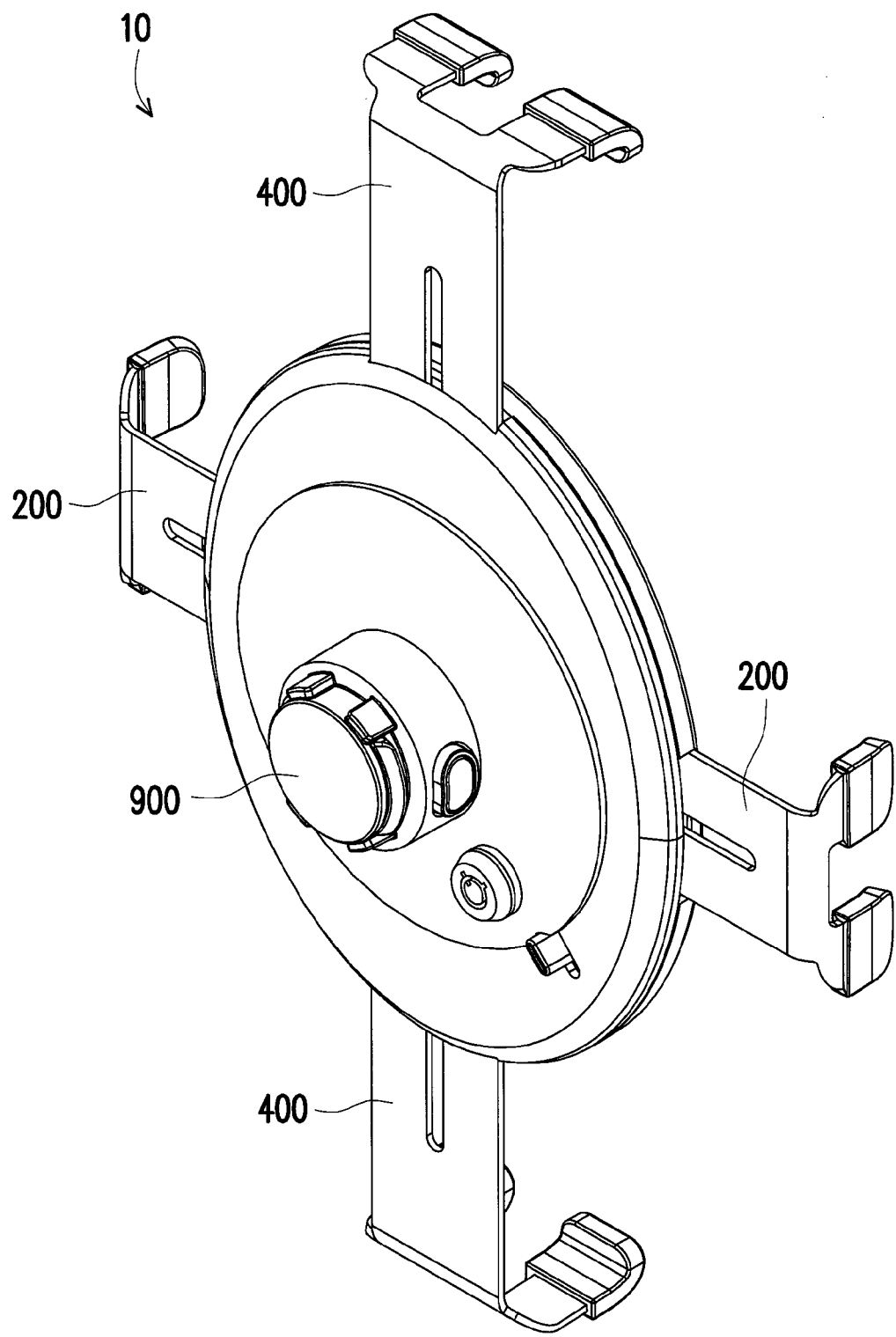
FIG. 2A is a perspective schematic diagram of a holding module according to an embodiment of the invention.
Figure 2B:
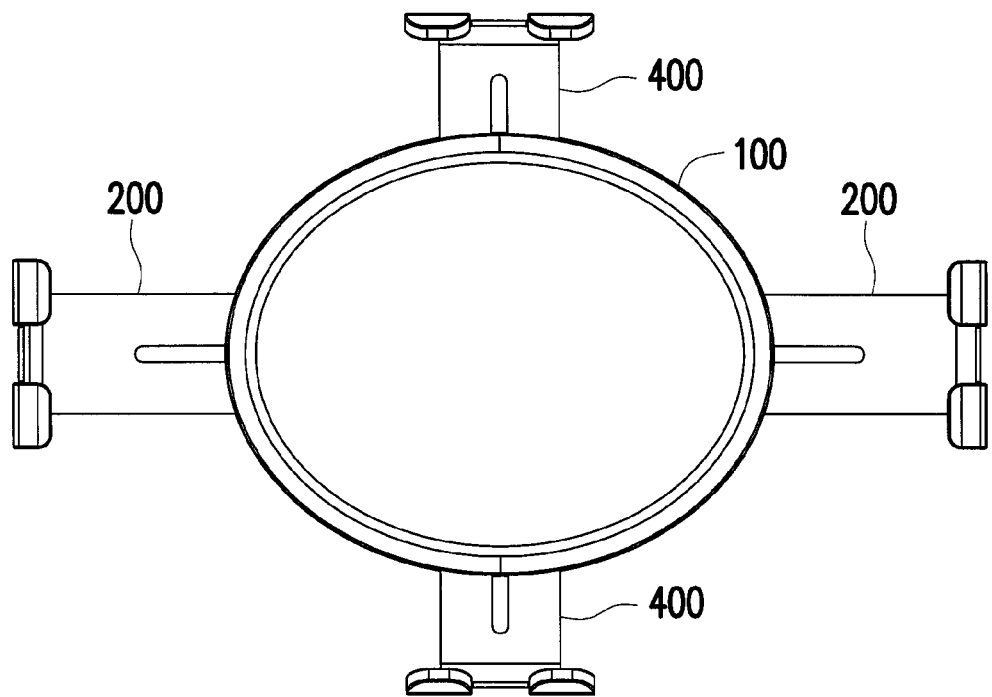
FIG. 2B and FIG. 2C are schematic diagrams illustrating the holding module of FIG. 2A in different viewing angles.
Figure 2C:
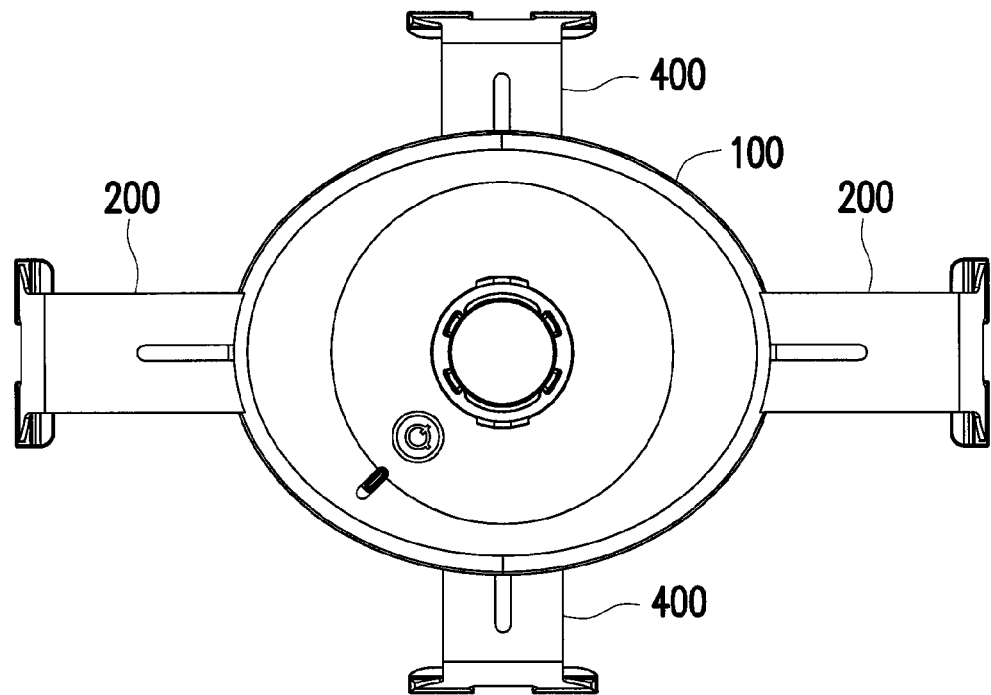
Figure 3:
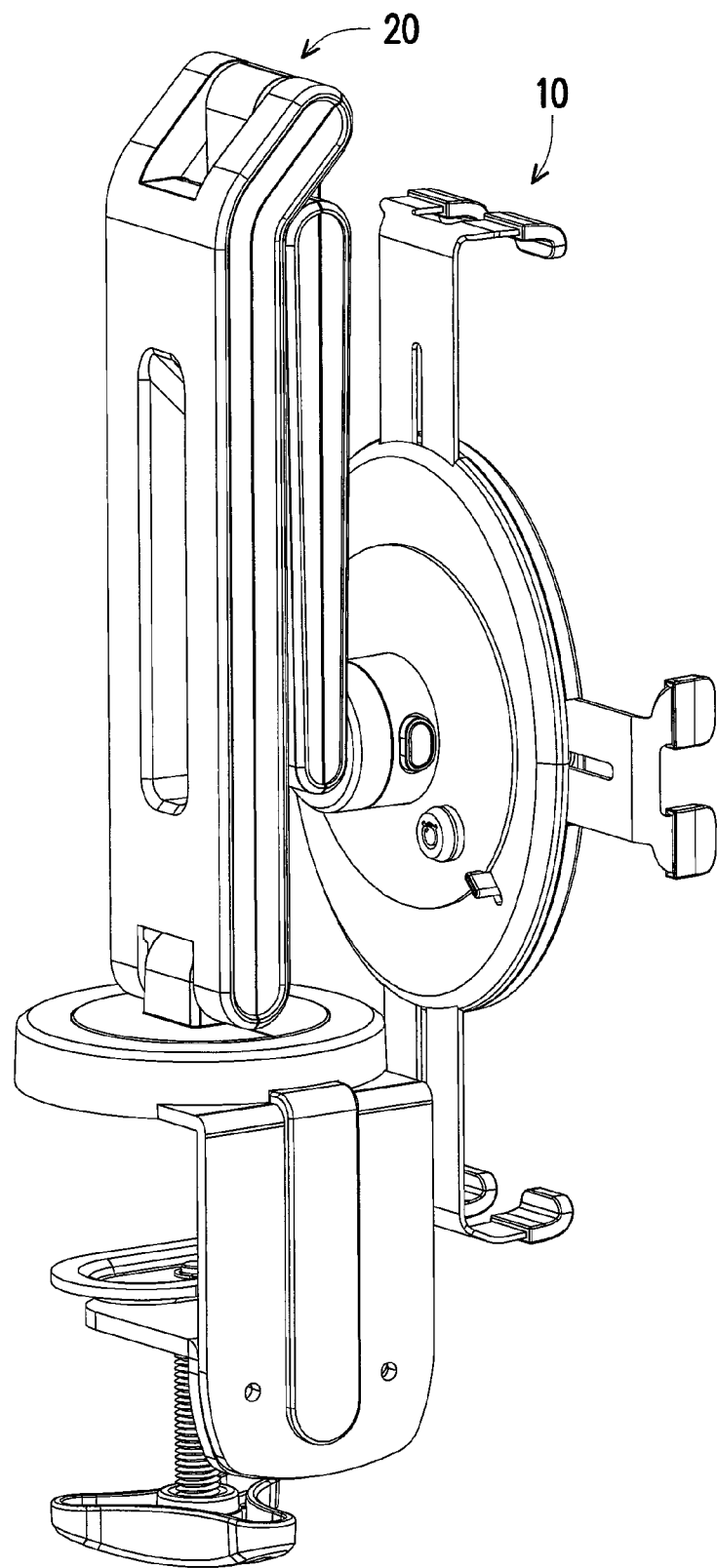
FIG. 3 is a schematic diagram illustrating the holding module of FIG. 2A which is fixed to the supporting base.

FIG. 2A is a perspective schematic diagram of a holding module according to an embodiment of the invention. FIG. 2B and FIG. 2C are schematic diagrams illustrating the holding module of FIG. 2A in different viewing angles. FIG. 3 is a schematic diagram illustrating the holding module of FIG. 2A which is fixed to a supporting base. With reference to FIG. 2A through FIG. 3, in present embodiment, two first holding members 200 and two second holding members 400 respectively disposed at opposite sides of a holding module 10 may be adjustably exposed from a body 100 to jointly fixed an object (not shown), thus offering a function of quickly fixing the object. The object is, for example, an electronic apparatus having a panel display, such as a tablet computer, a smart phone, a liquid crystal display or the like, but the type of the object is not limited in the invention. Additionally, the holding module 10 of the present embodiment may be assembled to a supporting base 20 as illustrated in FIG. 3, such that with the coordination of the holding module 10 and the supporting base 20, the object may stand on a table, or may be fixed to a wall.

Figure 4:
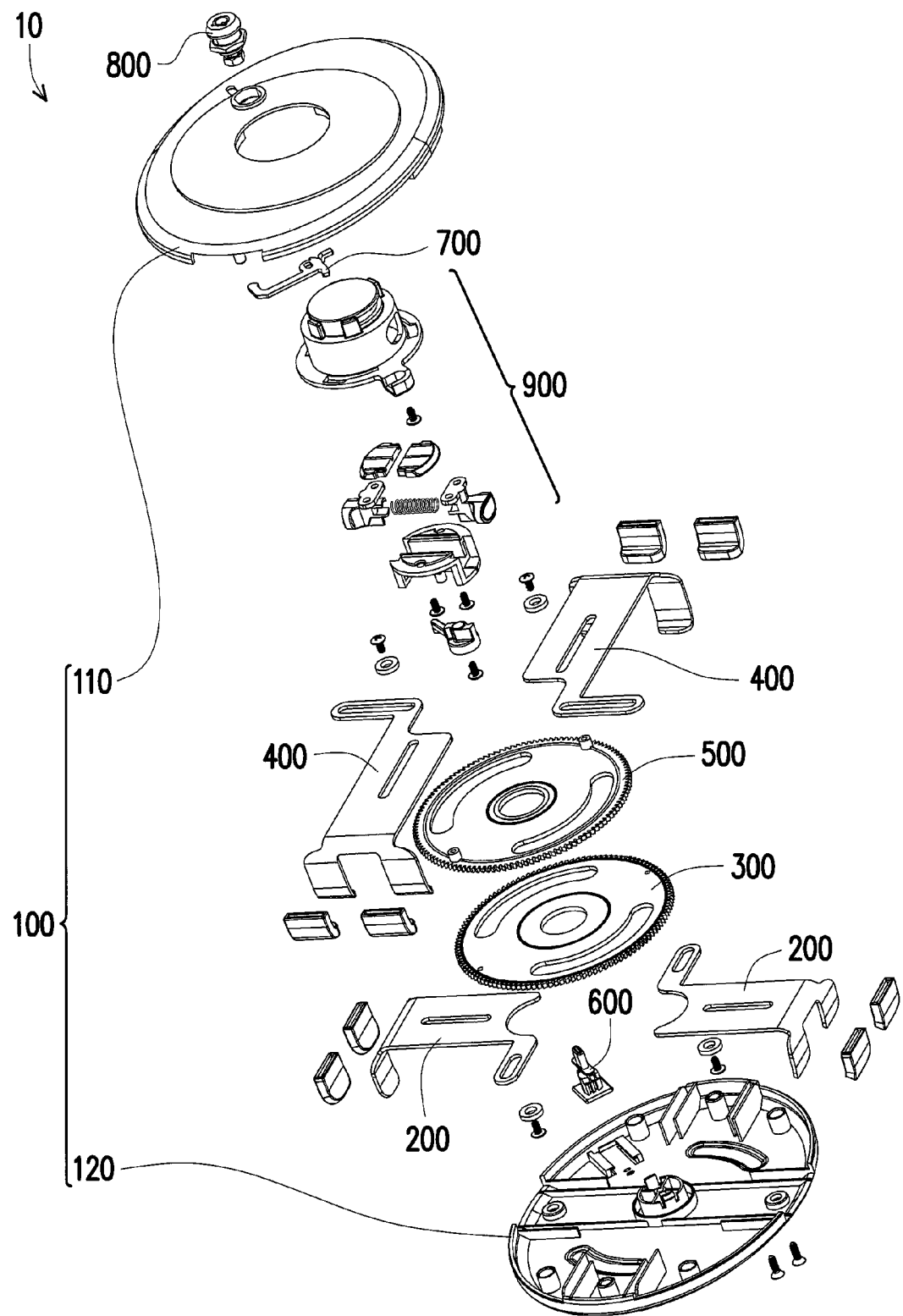
FIG. 4 is an exploded schematic diagram of the holding module of FIG. 2A.

FIG. 4 is an exploded schematic diagram of the holding module of FIG. 2A. With reference to FIG. 4, a holding module 10 of the present embodiment includes a body 100, two first holding members 200, a first rotating member 300, two second holding members 400, a second rotating member 500, a stopper member 600, a swiveling member 700 and a lock unit 800. The body 100 includes a first casing 110 and a second casing 120. The first holding members 200, the first rotating member 300, the second holding members 400, the second rotating member 500, the stopper member 600, the swiveling member 700 and the lock unit 800 are at least partially located between the first casing 110 and the second casing 120. The configuration and the operation relation among each of the aforementioned elements will be described in detail below. Moreover, in present embodiment, the holding module 10 further includes a quick release device 900. The supporting base 20 depicted in FIG. 3 may have a structure corresponding to the quick release device 900, such that the holding module 10 may be quickly installed on or detached from the supporting base 20. Details related to the quick release device 900 has been disclosed and described in another application titled as "QUICK RELEASE DEVICE" of the same inventors, which will not be repeated through out the specification. In practice, the object may still be quickly fixed without the quick release device 900.

Figure 5A:
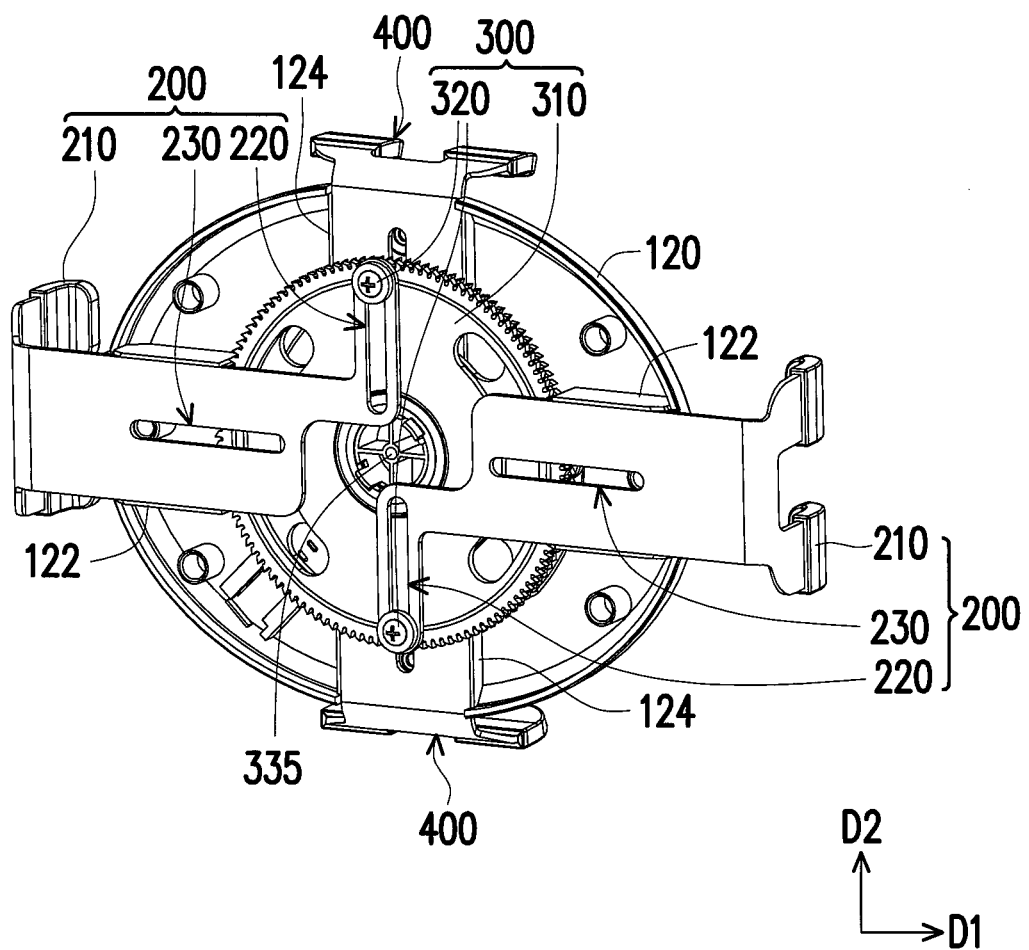
FIG. 5A is a schematic diagram illustrating the two first holding members of the holding module of FIG. 2A approaching each other.
Figure 5B:
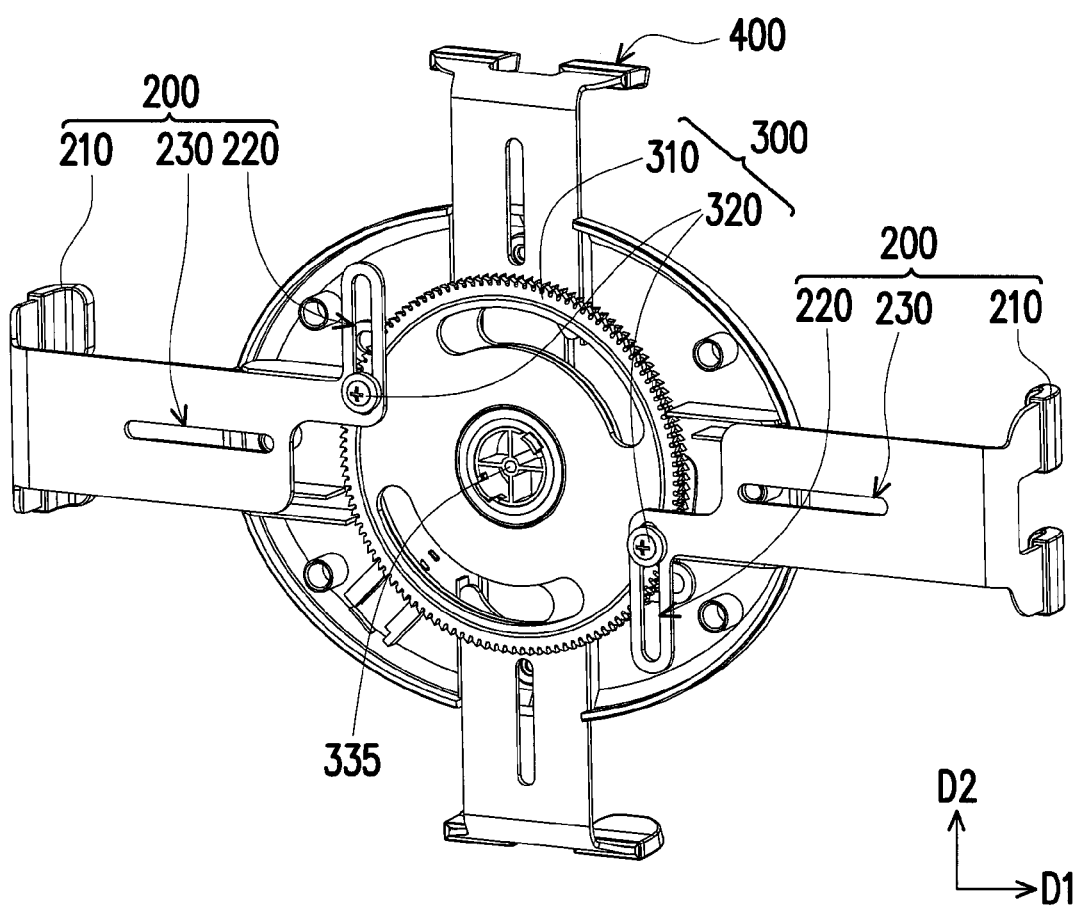
FIG. 5B is a schematic diagram illustrating the two first holding members of the holding module of FIG. 2A departing from each other.

FIG. 5A is a schematic diagram illustrating the two first holding members of the holding module of FIG. 2A approaching each other, and FIG. 5B is a schematic diagram illustrating the two first holding members of the holding module of FIG. 2A departing from each other. In FIG. 5A and FIG. 5B, the first casing 110 is intentionally hidden to clearly illustrate the deposition and operation relations between the first holding members 200 and the first rotating member 300. With reference to FIG. 5A and FIG. 5B, the two first holding members 200 are retractably disposed at two opposite sides of the body 100 and are retractable along a first direction D1. Each of the first holding members 200 includes a first clamping part 210, a first groove 220 along a second direction D2 and a second groove 230 along the first direction D1. The two first clamping parts 210 are exposed from the body 100 and may serve for holding and fixing an object. A nonzero angle is included between the first direction D1 and the second direction D2. In present embodiment, the first direction D1 is perpendicular to the second direction D2, that is, the included angle between the first direction D1 and the second direction D2 is 90 degrees, but is not limited thereto.

The first rotating member 300 may be rotatably disposed at the body 100, that is, the first rotating member 300 may be rotatably sleeved on an unrotatable shaft 335. In present embodiment, the first rotating member 300 includes a disc 310 sleeved on the shaft 335 and two first protrusions 320 separately disposed on the disc 310. Each of the first protrusions 320 protrudes to the corresponding first groove 220 of each of the first holding members 200 respectively. In present embodiment, the disc 310 is a circular gear and the first protrusions 320 are screws, with corresponding screw holes disposed on the disc 310. The disc 310 is not limited to the circular gear, but the circular gear offers a better fixing effect of engagement, which will be described below. When assembling the first protrusions 320 to the disc 310, first, the first grooves 220 of the first holding members 200 are respectively aligned with the screw holes on the disc 310, and then, the first protrusions 320 passes through the first grooves 220 and are fixed to the screw holes on the disc 310 by being screwed thereon. Referring to FIG. 5A, each of the first protrusions 320 has a screw cap with a width greater than a width of each first groove 220, and the first protrusions 320 may keep the first holding members 200 from departing away from the first rotating member 300. Certainly, the shape of the first rotating member 300, the types and fixing manners of the first protrusions 320 are not limited thereto.

In other embodiments, the first protrusions 320 may also be fixed to the disc 310 by other means, such as being adhered thereto. Alternatively, the first protrusions 320 may be integrated with the disc 310 and protruded from the disc 310 with the top being a flexible umbrella part. The flexible umbrella part has a width greater than the width of each first groove 220.

Figure 6A:
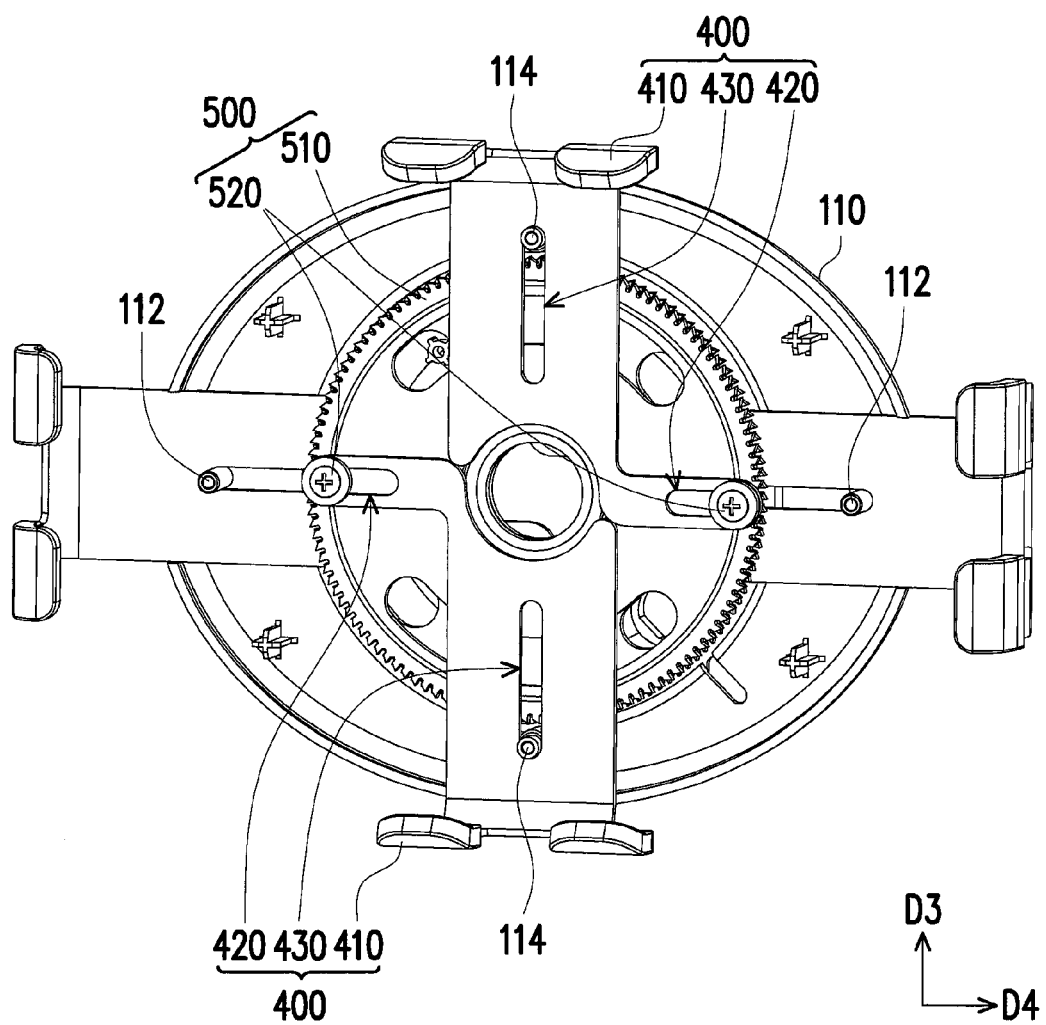
FIG. 6A is a schematic diagram illustrating two second holding members of the holding module of FIG. 2A approaching each other.
Figure 6B:
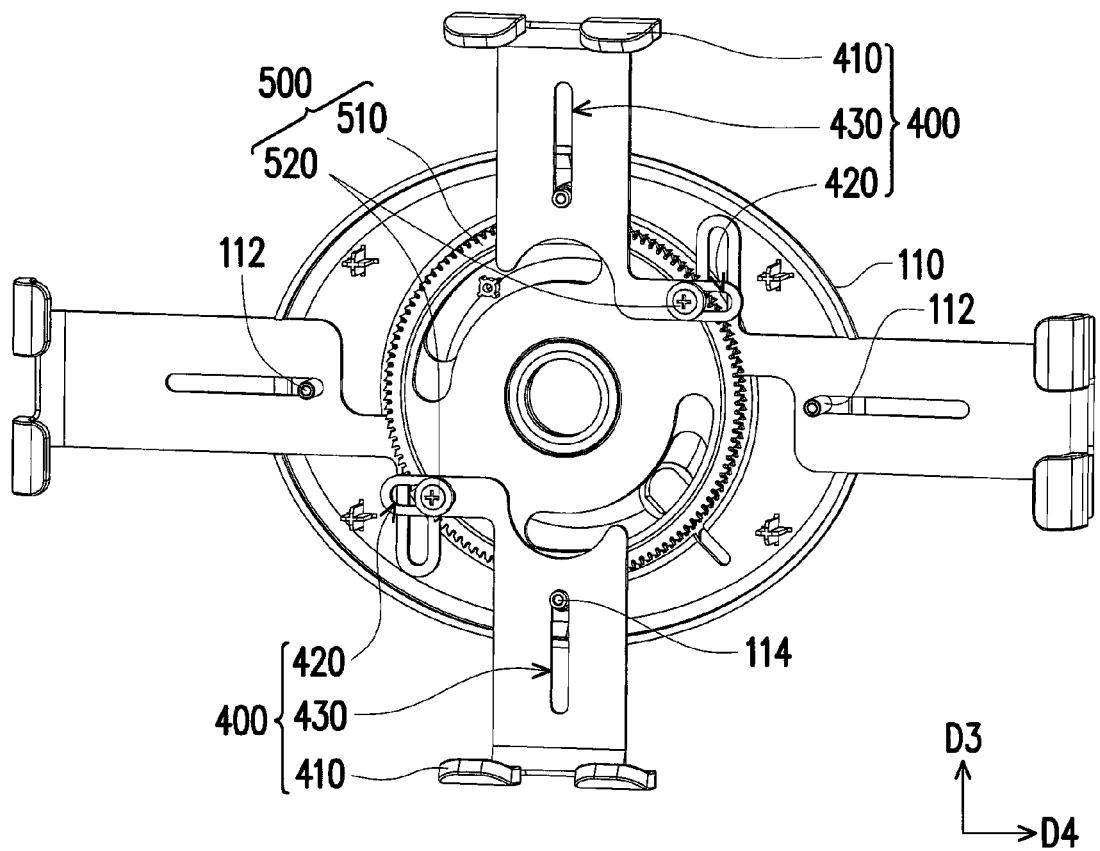
FIG. 6B is a schematic diagram illustrating the two second holding members of the holding module of FIG. 2A departing from each other.

In addition, FIG. 6A is a schematic diagram illustrating two second holding members of the holding module of FIG. 2A approaching each other, and FIG. 6B is a schematic diagram illustrating the two second holding members of the holding module of FIG. 2A departing from each other. It is to be mentioned that in FIG. 6A and FIG. 6B, the second casing 120 is intentionally hidden to clearly illustrate the deposition and operation relations between the second holding member 400 and the second rotating member 500. Referring to FIG. 5A through FIG. 6B, the first casing 110 (illustrated in FIG. 6A) includes two separate first pillars 112 and two separate second pillars 114, and the second casing 120 (illustrated in FIG. 5A) includes two first rails 122 extending along the first direction D1 and two second rails 124 extending along a third direction D3. In the present embodiment, the third direction D3 illustrated in FIG. 6A and FIG. 6B is parallel to the second direction D2 illustrated in FIG. 5A and FIG. 5B. However, in other embodiments, the third direction D3 may not have to be parallel to the second direction D2. Each of the first pillars 112 protrudes to the second groove 230 of each of the first holding members 200, and each of the second pillars 114 protrudes to a fourth groove 430 of each of the second holding members 400 respectively. By the above coordination and with the two first holding members 200 and the two second holding members 400 are respectively disposed in the first rails 122 and the second rails 124 of the second casing 120, the two first holding members 200 and the two second holding members 400 are capable of stably moving along the first direction D1 and along the third direction D3, respectively.

Description with respect to the operation of the two first holding members 200 will be set forth below. With referring to FIG. 5A and FIG. 5B, if the two first holding members 200 are needed to be departed from each other, only one of the first holding members 200 should be moved. For instance, when moving the first holding member 200 at the right of FIG. 5A along the first rail 122 to the right, the first groove 220 of the right first holding member 200 also moves rightward. The first protrusion 320 at the lower part of FIG. 5A, being located in the right first groove 220, will move rightward accompanying with the right first groove 220. Since the first protrusions 320 is fixed to the disc 310, the disc 310 is driven to rotate counterclockwise, when the first protrusions 320 is driven by the right first groove 220 to move rightward. Such rotation drives the right first protrusion 320 to move upward relatively to the first groove 220. Thus, the first protrusion 320 originally located at the lower part of FIG. 5A is moved toward upper right to the position shown in FIG. 5B.

During the above-mentioned moving of the lower first protrusion 320, the disc 310 which is driven to rotate counterclockwise also drives the first protrusion 320 originally located at the upper part of FIG. 5A to rotate toward the lower left, such that the upper first protrusion 320 pushes a side wall of the upper first groove 220 to the left, and moves downward relatively to the first groove 220. The left first holding member 200 is thus pushed by the first protrusion 320 to move along the first rail 122 to the left. Thereby, the two first holding members 200 are pulled to depart away from each other as illustrated in FIG. 5B, and namely, a distance between the two first holding members 200 becomes relatively large.

On the other hand, the elements may be operated inversely by pressing either one of the first holding members 200 inward so as to return the state of the two first holding members 200 as illustrated in FIG. 5B back to that in FIG. 5A, and at this time, the disc 310 rotates clockwise. The details will not be repeatedly described.

In other words, by moving only one of the first holding members 200, the corresponding first groove 220 may drive the corresponding first protrusions 320, such that the first rotating member 300 turns and synchronously drives the other first protrusion 320 to push the other first holding member 200, and thereby, the two first clamping parts 210 depart away from or approach each other.

Additionally, in present embodiment, the two first protrusions 320 is disposed on two opposite positions on the disc 310. That is to say, a connection line of the two first protrusions 320 passes through the center of the disc 310, and each of the two first protrusions 320 departs away from the center with an equal distance. Thus, when the disc 310 rotates, a movement distance of each of the two first protrusions 320 is the same, a projection of the movement distance of each of the two first protrusions 320 along the first direction D1 is the same, and a movement distance of each of the two first holding members 200 is the same. However, the positions where the two first protrusions 320 are disposed on the disc 310 are not limited thereto.

Afterwards, description with respect to the operation of the two second holding members 400 will be set forth below. The two second holding members 400 are retractably disposed at two opposite sides of the body 100 along the third direction D3. Each of the second holding members 400 includes a second clamping part 410, a third groove 420 along a fourth direction D4 and a fourth groove 430 along the third direction D3. In present embodiment, the third direction D3 is parallel to the second direction D2, and the fourth direction D4 is parallel to the first direction D1. However, in other embodiments, the third direction D3 may not have to be parallel to the second direction D2, and the fourth direction D4 may not have to be parallel to the first direction D1. For example, a nonzero angle included between the third direction D3 and the fourth direction D4 is acceptable.

The second rotating member 500 may be rotatably disposed to the body 100 and adjacent to one side of the first rotating member 300 away from the first protrusions 320. The second rotating member 500 includes a disc 510 rotatably sleeved on the shaft 335 and two third protrusions 520 on the disc 510. The two third protrusions 520 respectively protrude toward a direction away from the first rotating member 300 and penetrate the corresponding third grooves 420. Similar to the above description with respect to the first holding members 200, by moving only one of the second holding members 400, the corresponding third groove 420 may drive the third protrusions 520, such that the second rotating member 500 turns and synchronously drives the other third protrusion 520 to push the other second holding member 400, and thereby, the two second clamping parts 410 depart away from or approach each other.

After the two first holding members 200 and the two second holding members 400 are adjusted to required positions, in present embodiment, the relative positions of the two first holding members 200 and the relative positions of the two second holding members 400 can be fixed by the stopper member 600. In other words, the object can be stably and fixedly held in that way.

Figure 7A:
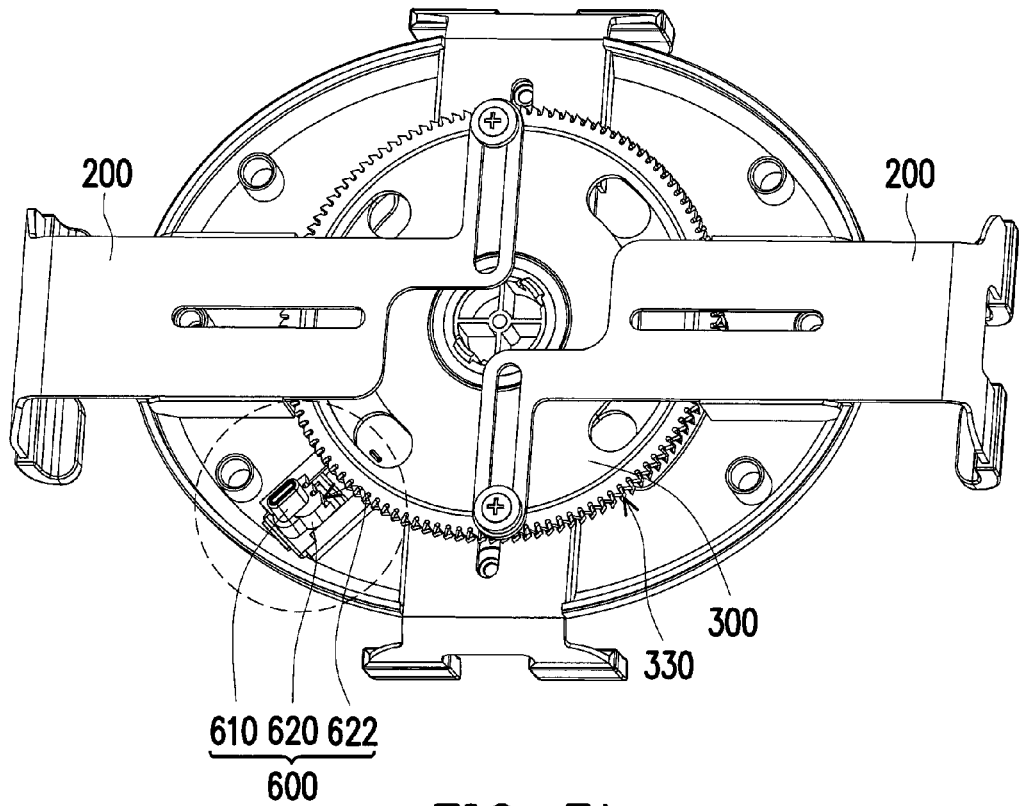
FIG. 7A is a schematic diagram illustrating the stopper member of the holding module of FIG. 2A departing from the first rotating member.
Figure 7B:
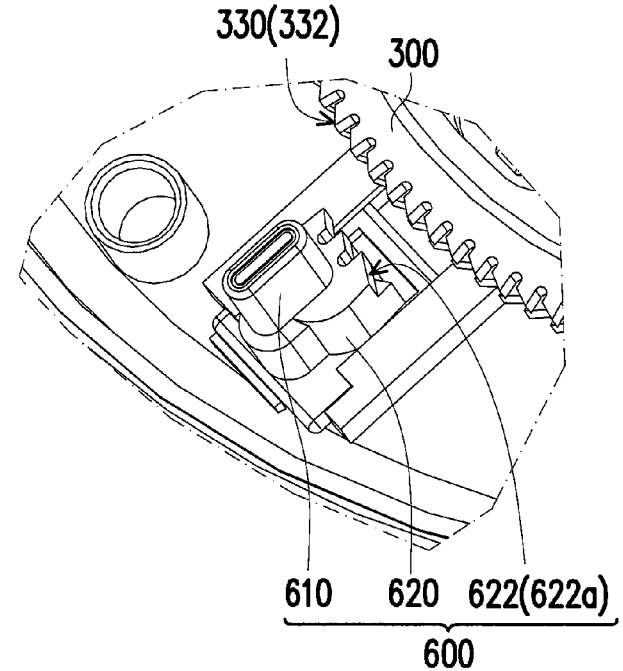
FIG. 7B is a partially enlarged schematic diagram of FIG. 7A.
Figure 7C:
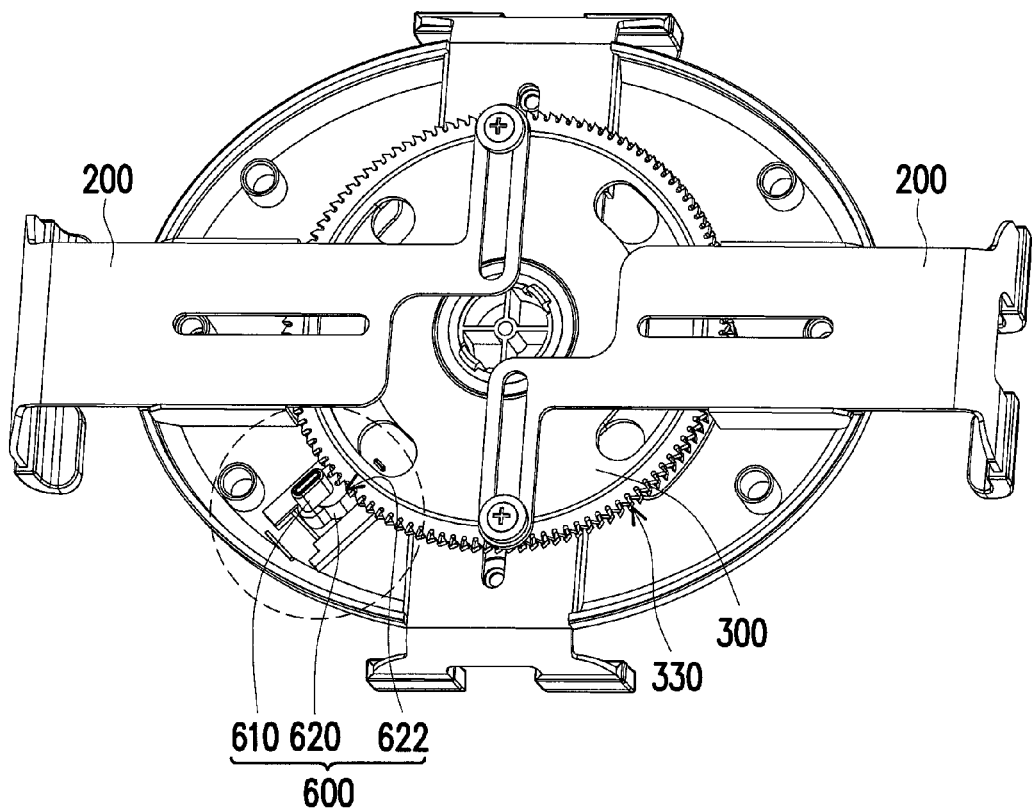
FIG. 7C is a schematic diagram illustrating the stopper member of the holding module of FIG. 2A contacting the first rotating member.
Figure 7D:
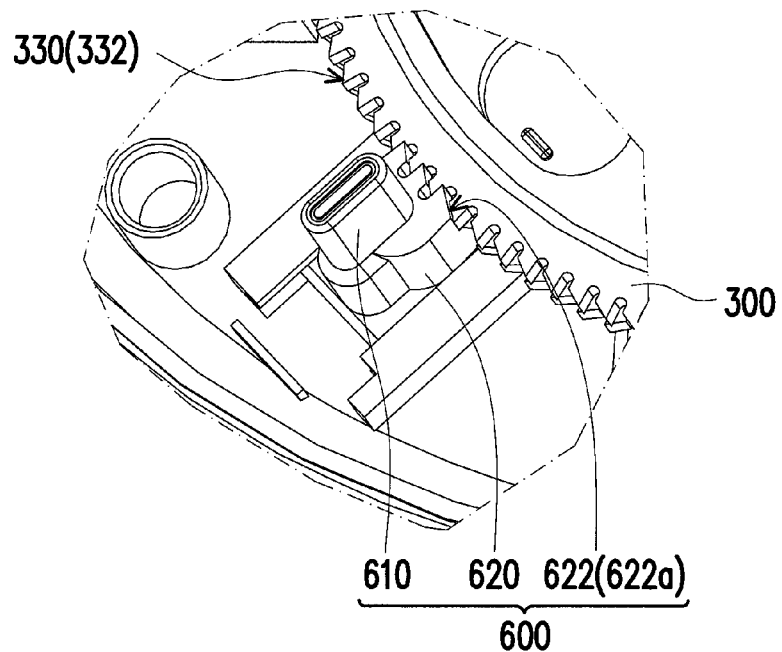
FIG. 7D is a partially enlarged schematic diagram of FIG. 7C.

FIG. 7A is a schematic diagram illustrating the stopper member of the holding module of FIG. 2A departing from the first rotating member, and FIG. 7B is a partially enlarged schematic diagram of FIG. 7A. FIG. 7C is a schematic diagram illustrating the stopper member of the holding module of FIG. 2A contacting the first rotating member, and FIG. 7D is a partially enlarged schematic diagram of FIG. 7C. In FIGS. 7A, 7B, 7C and 7D, due to the limitations by the viewing angles, only the relative coordination of the stopper member 600 and the first rotating member 300 is shown, and thus, only the operation of the stopper member 600 and the first rotating member 300 is illustrated as an example. In fact, the relative operation of the stopper member 600 and the second rotating member 500 is also the same, and thus, will not be repeatedly described hereinafter.

With reference to FIG. 7A and FIG. 7B, the stopper member 600 is located at a side surface 330 of the first rotating member 300 and includes a switching part 610 and a fixing part 620 which are connected to each other. The fixing part 620 is located in the body 100 and has a contact surface 622. The contact surface 622 of the fixing part 620 has sawteeth 622a thereon for correspondingly meshing sawteeth 332 of the side surface 330 of the first rotating member 300. When the stopper member 600 departs away form the first rotating member 300, the first rotating member 300 may rotate freely, and thus, the two first holding members 200 may either approach or depart away from each other.

When it is necessary to fix the relative positions of the two first holding members 200, the stopper member 600 is pushed to approach the first rotating member 300. As the stopper member 600 contacts the first rotating member 300, as shown in FIG. 7C and FIG. 7D, the sawteeth 622a on the contact surface 622 of the fixing part 620 are engaged with the sawteeth 332 on the side surface 330 of the first rotating member 300. Thereby, the first rotating member 300 is incapable of being moved. In other words, the first holding members 200 are incapable of being moved accordingly.

As described above, by making the fixing part 620 of the stopper member 600 contact with or away from the first rotating member 300 and the second rotating member 500, the relative positions of the two first holding members 200 and the two second holding members 400 can be fixed.

It should be mentioned that the fixing part 620, stops the first rotating member 300 and the second rotating member 500 by engaging corresponding sawteeth thereof, respectively, in present embodiment. Nevertheless, in other embodiments, there may be rough surfaces formed on the fixing part 620, the first rotating member 300 and the second rotating member 500. When the fixing part 620 contacts the first rotating member 300 and the second rotating member 500, the first rotating member 300 and the second rotating member 500 are incapable of being moved due to friction. Certainly, it is not limited to the manners above.

Figure 8A:
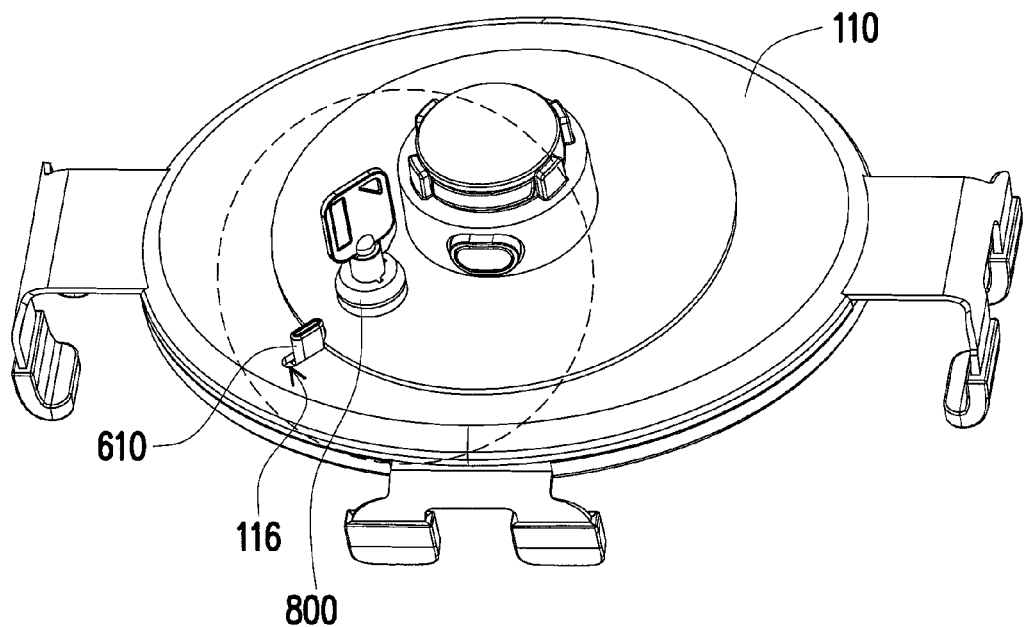
FIG. 8A is a schematic diagram illustrating the holding module of FIG. 2A in another viewing angle.
Figure 8B:
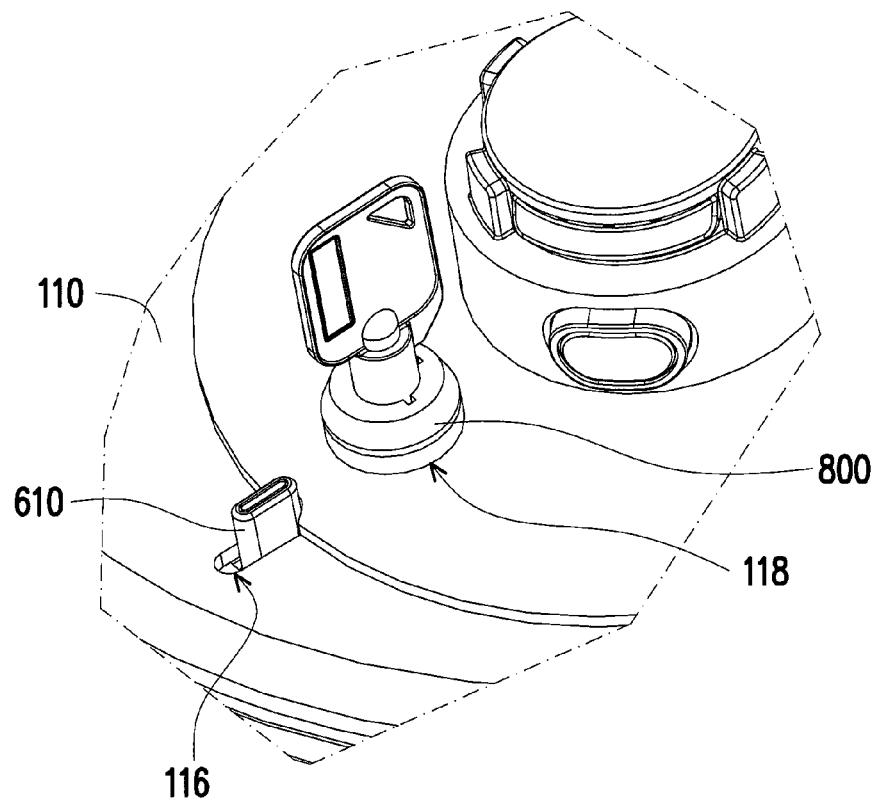
FIG. 8B is a partially enlarged schematic diagram of FIG. 8A.

Nevertheless, the aforementioned structures may stably hold the object, but can not prevent the first holding members 200 and the second holding members 400 from being pulled apart, and as a result, the object may be taken away. Therefore, the invention further provides a corresponding locking structure. FIG. 8A is a schematic diagram illustrating the holding module of FIG. 2A in another viewing angle, and FIG. 8B is a partially enlarged schematic diagram of FIG. 8A. With reference to FIG. 8A and FIG. 8B, the first casing 110 includes a through slot 116, the switching part 610 of the stopper member 600 passes through the through slot 116 and exposes to outside of the first casing 110, the through slot 116 extends in a direction toward the center of the first casing 110 (where the quick release device 900 is located). The switching part 610 which is exposed to the outside of the first casing 110 may be switched along the through slot 116, such that the fixing part 620 can be operated to contact or to depart away from the first rotating member 300 and the second rotating member 500.

Moreover, the first casing 110 includes a through hole 118 and a lock unit 800 partly disposed into the through hole 118. In present embodiment, the holding module 10 may maintain the fixing part 620 of the stopper member 600 contacting the first rotating member 300 and the second rotating member 500 by locking the lock unit 800, such that the two first holding members 200 and the two second holding members 400 are incapable of being adjusted. Accordingly, it prevents the object clamped by the two first holding members 200 and the two second holding members 400 from being taken away.

Figure 9A:
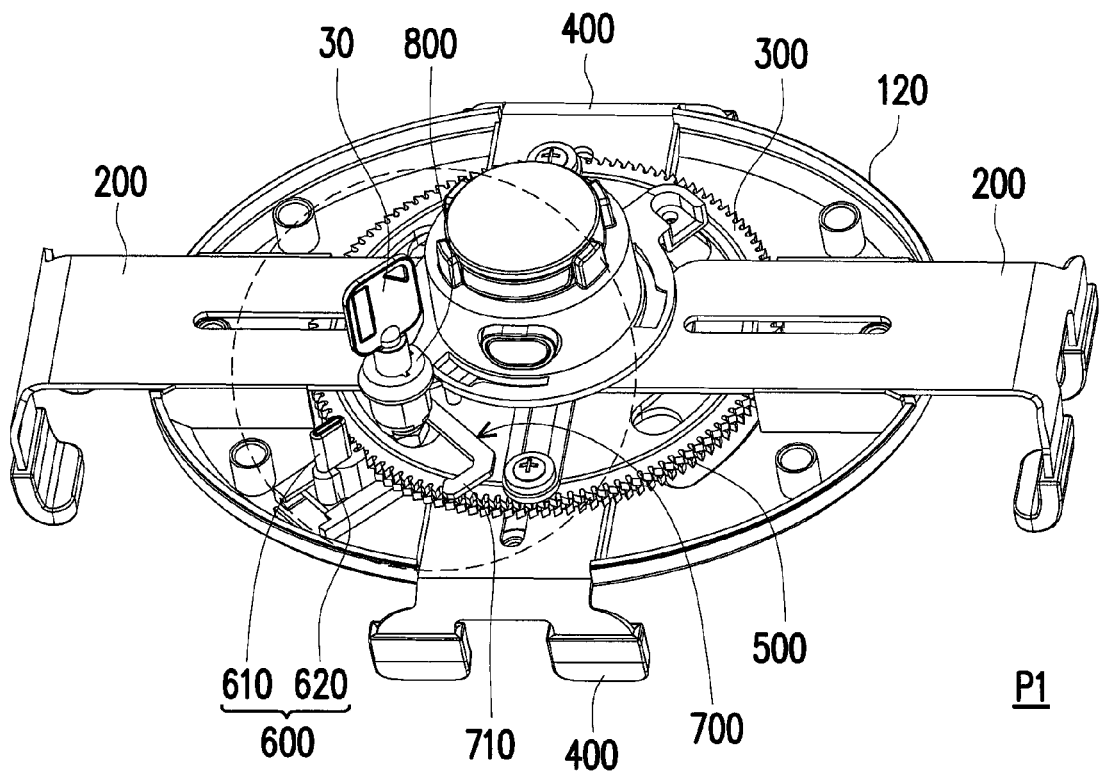
FIG. 9A is a schematic diagram illustrating a limiting hook of the holding module of FIG. 2A located in an unlocked position.
Figure 9B:
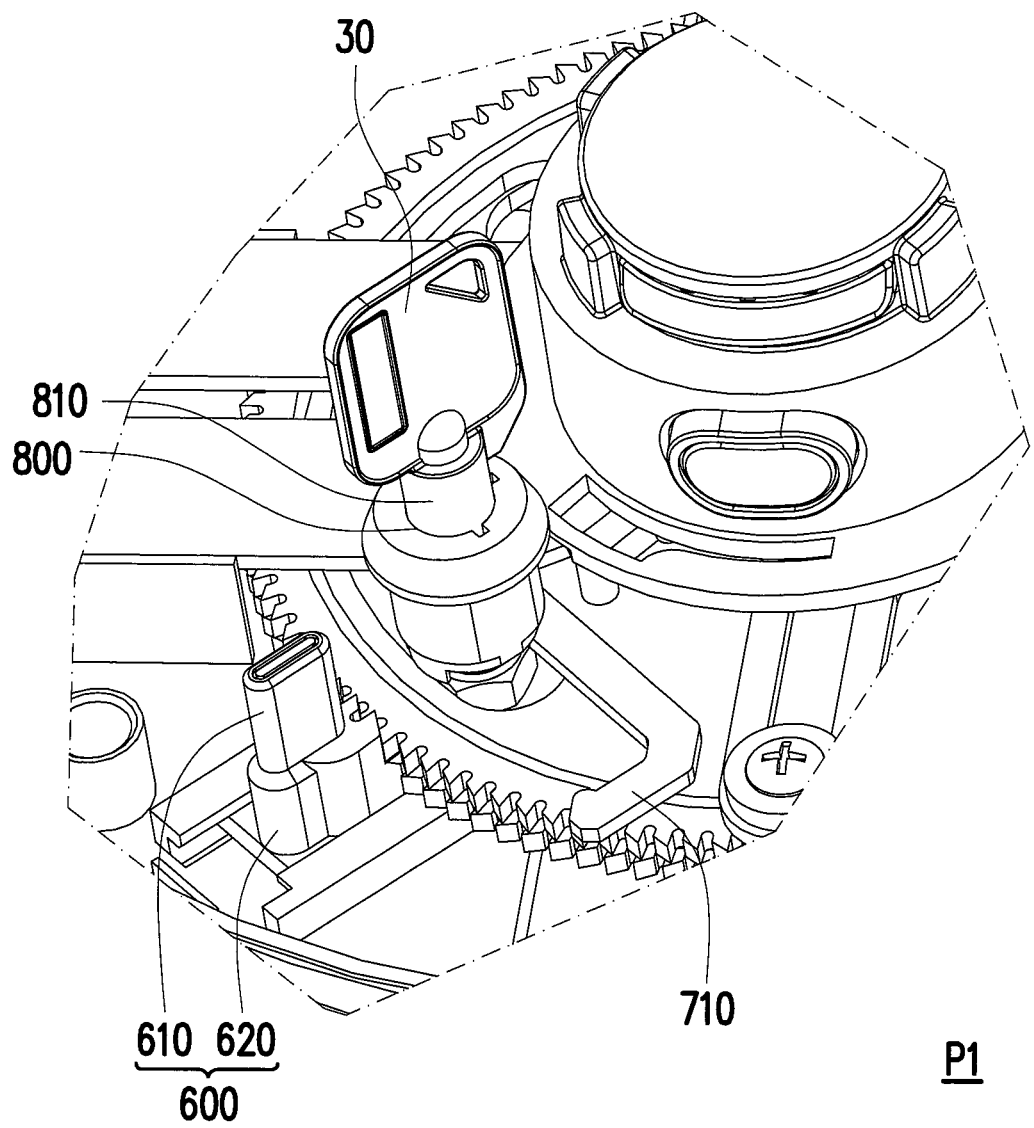
FIG. 9B is a partially enlarged schematic diagram of FIG. 9A.
Figure 9C:
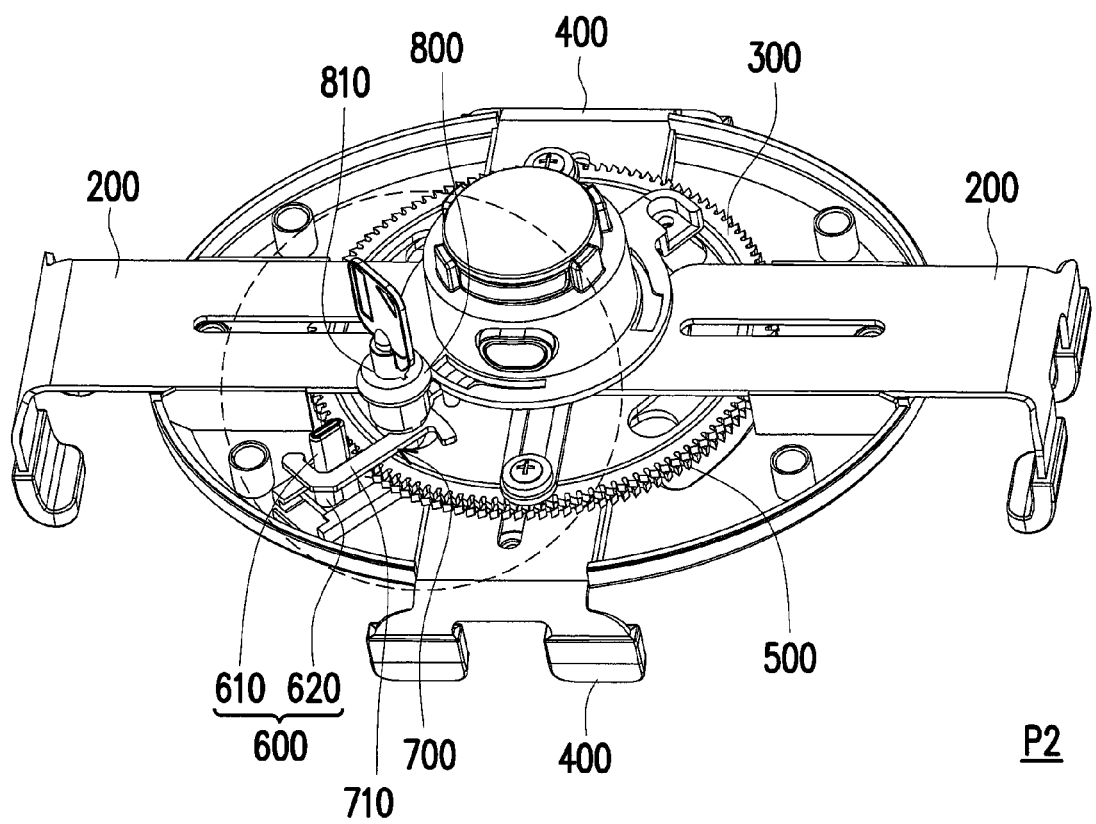
FIG. 9C is a schematic diagram illustrating the limiting hook of the holding module of FIG. 2A located in a locked position.
Figure 9D:
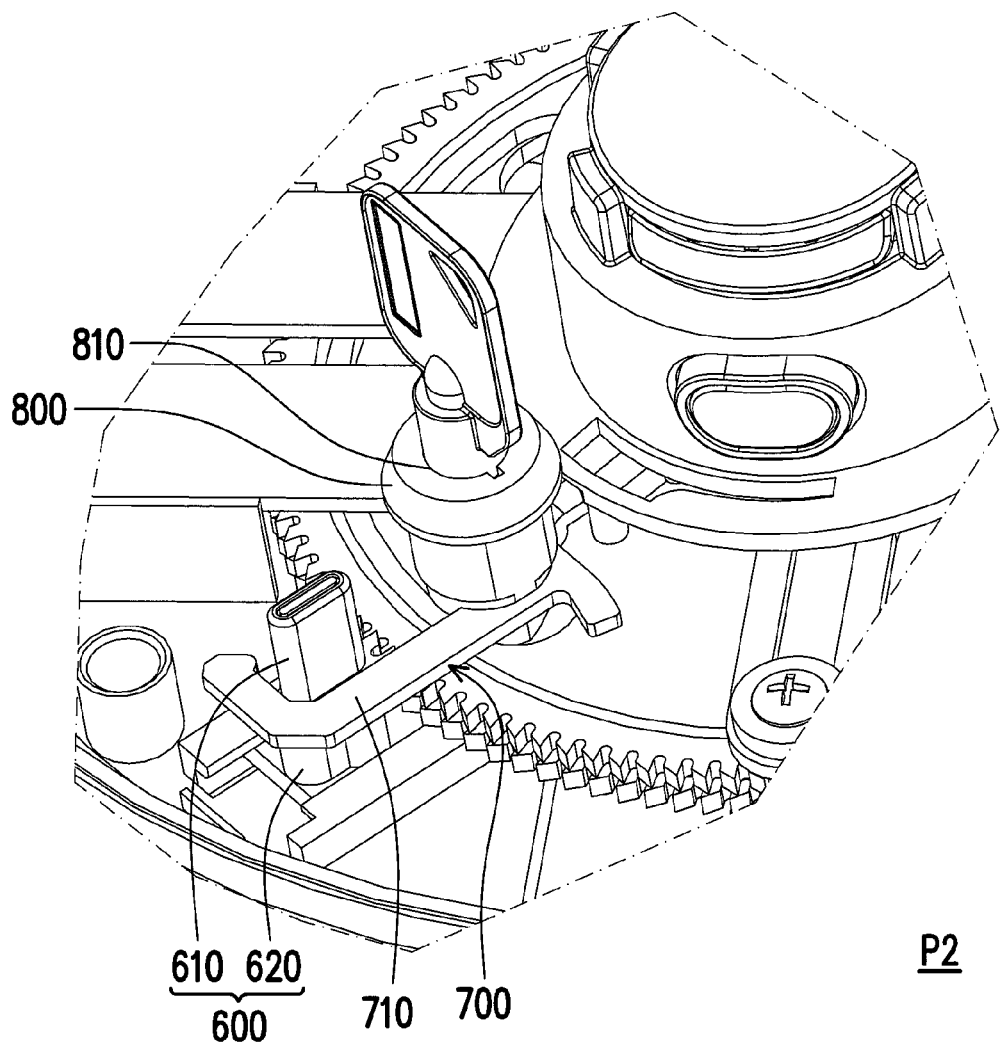
FIG. 9D is a partially enlarged schematic diagram of FIG. 9C.

FIG. 9A is a schematic diagram illustrating a limiting hook of the holding module of FIG. 2A located in an unlocked position, and FIG. 9B is a partially enlarged schematic diagram of FIG. 9A. FIG. 9C is a schematic diagram illustrating the limiting hook of the holding module of FIG. 2A located in a locked position, and FIG. 9D is a partially enlarged schematic diagram of FIG. 9C. It is to be mentioned that in FIG. 9A through FIG. 9D, the first casing 110 is intentionally hidden to clearly present how the stopper member 600 is limited by the lock unit 800. With reference from FIG. 9A to FIG. 9D, a lock core 810 of the lock unit 800 is linked with the swiveling member 700 located in the body 100. The swiveling member 700 is disposed at a side of the fixing part 620 and includes a limiting hook 710. When the lock core 810 is operated, the limiting hook 710 of the swiveling member 700 is also turned therewith between an unlocked position P1 (e.g., as illustrated in FIG. 9A and FIG. 9B) and a locked position P2 (e.g., as illustrated in FIG. 9C and FIG. 9D). The limiting hook 710 is on a moving path of the switching part 610 when being located at the locked position P2.

In present embodiment, when the stopper member 600 is moved to a position where the fixing part 620 is engaged with the first rotating member 300 and with the second rotating member 500, by operating the lock core 810 of the lock unit 800 through a key 30, the limiting hook 710 of the swiveling member 700 may be turned and then stays on the moving path of the switching part 610. By doing so, the switching part 610 is limited by the limiting hook 710 and is incapable of moving away from the first rotating member 300 and from the second rotating member 500. Accordingly, the relative distance between the two first holding members 200 and the relative distance between the two second holding members 400 can not be adjusted through moving the switching part 610 exposed to the outside of the first casing 110. Thus, the object can be prevented from being taken away.

Figure 10:
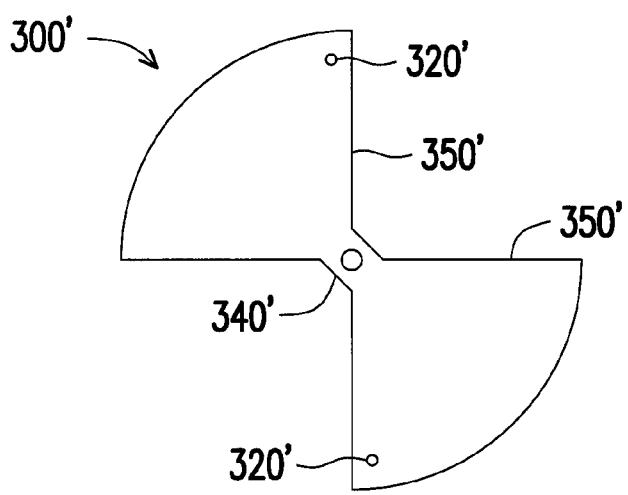
FIG. 10 is a schematic diagram illustrating a first rotating member of a holding module according to another embodiment of the invention.

Additionally, a first rotating member with another different shape is provided below. FIG. 10 is a schematic diagram illustrating a first rotating member of a holding module according to another embodiment of the invention. With reference to FIG. 10, a first rotating member 300' includes a connecting part 340' and two fan-shaped parts 350' extending outward from the connecting part 340'. In present embodiment, a central angle of each of the two fan-shaped parts 350' is 90 degrees, but not limited thereto. Two first protrusions 320' are respectively located on the two fan-shaped parts 350', with a connection line of the two first protrusions 320' passing through the connecting part 340'. Each of the two first protrusions 320' is equidistant to the connecting part 340'. In other words, when the connecting part 340' and the two fan-shaped parts 350' turn, each of the two first protrusions 320' moves with the same path length, and a projection of the distance turned by each of the two first protrusions 320' along the first direction D1 is the same. Accordingly, each of the two first holding members (not shown) linked with the first rotating member 300' may move the same distance.

Certainly, in other embodiments, the connection line between the two first protrusions 320' respectively located on the two fan-shaped parts 350' may not pass through the connecting part 340', and the two first protrusions 320' may have different distances to the connecting part 340' respectively. Even with the above-mentioned configuration, the two first holding members are still capable of holding the object.

To sum up, the holding module of the invention can hold an object, such as an electronic apparatus, by the two first holding members and the two second holding members which respectively extend along different directions. The two first holding members are respectively linked with the first grooves through the first protrusions of the first rotating member, and the two second holding members are respectively linked with the third grooves through the second protrusions of the second rotating member, such that by moving one of the first holding members and one of the second holding members, the other first holding member and the other second holding member can be synchronously driven, respectively. Additionally, the rotation of the first rotating member and the second rotating member can be forbidden through adjusting the position of the stopper member so as to fix the relative positions of the two first holding members and the relative positions of the two second holding members. Moreover, in the holding module of the invention, because the lock core of the lock unit is linked with the swiveling member in the body, the limiting hook of the swiveling member can be turned and stays on the moving path of the stopper member for limiting the movement of the stopper member. By doing so, the object located in the two first holding members and the two second holding members will not be accidentally taken away.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A holding module, comprising:
    a body;
    two first holding members, retractably disposed at two opposite sides of the body along a first direction, and each comprising a first clamping part and a first groove along a second direction, wherein a nonzero angle is included between the first direction and the second direction;
    a first rotating member, rotatably disposed at the body and comprising two first protrusions separated from each other, wherein the first protrusions respectively protrude to the corresponding first grooves,
    wherein when one of the first holding members is moved, the corresponding first groove of the one of the first holding members drives one of the first protrusions to rotate the first rotating member and synchronically drives the other first protrusion to push the other first holding member, such that the two first clamping parts approach or depart away from each other;
    a stopper member, movably disposed in the body, located at a side of the first rotating member and adapted to contact or depart away from the first rotating member, wherein when the stopper member contacts the first rotating member, the first rotating member is incapable of rotating, wherein the stopper member comprises a switching part and a fixing part connected with each other, and the body has a first casing comprising a through slot, wherein the fixing part is located in the first casing, the switching part passes through the through slot and exposes to outside of the first casing, and the through slot extends along a direction perpendicular to the protruding direction of the switching part, and the switching part is adapted to move along the through slot, such that the fixing part contacts or departs away from the first rotating member; and a swiveling, member, disposed in the first casing and near the fixing part, and comprising a limiting hook capable of being turned to stay on a moving path of the switching part, so as to retain a relative position of switching part in the through slot.

2. The holding module according to claim 1, further comprising:

a lock unit, comprising a lock core linked with the swiveling member in the body, wherein the first casing has a through hole, the lock unit is disposed partly into a through hole, wherein when the lock core is turned, the limiting hook of the swiveling member switches between a locked position and an unlocked position.

3. The holding module according to claim 2, wherein the first rotating member comprises a side surface, the stopper member comprises a contact surface, and the stopper member contacts the first rotating member with the contact surface in the locked position.

4. The holding module according to claim 3, wherein the side surface of the first rotating member and the contact surface of the stopper member correspondingly comprise sawteeth.

5. The holding module according to claim 1, wherein the first direction is perpendicular to the second direction.

6. The holding module according to claim 1, wherein the first rotating member comprises a disc.

7. The holding module according to claim 1, wherein the first rotating member comprises a connecting part rotatably disposed to the body and two fan-shaped parts respectively extending outward from the connecting part, wherein the two first protrusions respectively are located on the two fan-shaped parts and a connection line of the two first protrusions passes through the connecting part.

8. The holding module according to claim 1, wherein each of the first holding members further comprises a second groove along the first direction, and the body comprises a first casing having two first pillars respectively protruding to the second grooves.

9. The holding module according to claim 1, wherein the body comprises a second casing having two first rails along the first direction, and the two first holding members are respectively disposed at the two first rails.

10. The holding module according to claim 1, further comprising:

two second holding members, retractably disposed at two opposite sides of the body along a third direction, wherein each of the two second holding members comprises a second clamping part and a third groove along a fourth direction; and a second rotating member, rotatably disposed to the body, adjacent to a side of the first rotating member that is away from the first protrusions and comprising two third protrusions protruding toward a direction that is away from the first rotating member, wherein the third protrusions respective protrudes to the corresponding third grooves.

11. The holding module according to claim 10, wherein each of the second holding members further comprises a fourth groove along the third direction, and the body comprises a first casing having two second pillars respectively protruding to the fourth grooves.

12. The holding module according to claim 10, wherein the body comprises a second casing having two second rails along the third direction, and the second holding members are respectively disposed at the two second rails.

13. A holding module, comprising:

a body;

two first holding members, retractably disposed at two opposite sides of the body along a first direction, and each comprising a first clamping part and a first groove along a second direction, wherein a nonzero angle is included between the first direction and the second direction; and a first rotating member, rotatably disposed at the body and comprising two first protrusions separated from each other, wherein the first protrusions respectively protrude to the corresponding first grooves, wherein when one of the first holding members is moved, the corresponding first groove of the one of the first holding members drives one of the first protrusions to rotate the first rotating member and synchronically drives the other first protrusion to push the other first holding member, such that the two first clamping parts approach or depart away from each other, wherein the first rotating member comprises a connecting part rotatably disposed to the body and two fan-shaped parts respectively extending outward from the connecting part, wherein the two first protrusions respectively are located on the two fan-shaped parts and a connection line of the two first protrusions passes through the connecting part.

14. The holding module according to claim 13, wherein each of the first holding members further comprises a second groove along the first direction, and the body comprises a first casing having two first pillars respectively protruding to the second grooves.

15. The holding module according to claim 13, wherein the body comprises a second casing having two first rails along the first direction, and the two first holding members are respectively disposed at the two first rails.

16. A holding module, comprising:

a body;

two first holding members, retractably disposed at two opposite sides of the body along a first direction, and each comprising a first clamping part and a first groove along a second direction, wherein a nonzero angle is included between the first direction and the second direction;

a first rotating member, rotatably disposed at the body and comprising two first protrusions separated from each other, wherein the first protrusions respectively protrude to the corresponding first grooves, wherein when one of the first holding members is moved, the corresponding first groove of the one of the first holding members drives one of the first protrusions to rotate the first rotating member and synchronically drives the other first protrusion to push the other first holding member, such that the two first clamping parts approach or depart away from each other;

two second holding members, retractably disposed at two opposite sides of the body along a third direction, wherein each of the two second holding members comprises a second clamping part and a third groove along a fourth direction; and a second rotating member, rotatably disposed to the body, adjacent to a side of the first rotating member that is away from the first protrusions and comprising two third protrusions protruding toward a direction that is away from the first rotating member, wherein the third protrusions respective protrudes to the corresponding third grooves.

17. The holding module according to claim 16, wherein each of the second holding members further comprises a fourth groove along the third direction, and the body comprises a first casing having two second pillars respectively protruding to the fourth grooves.

18. The holding module according to claim 16, wherein the body comprises a second casing having two second rails along the third direction, and the second holding members are respectively disposed at the two second rails.

19. The holding module according to claim 16, further comprising:

a stopper member, movably disposed in the body, wherein the stopper member comprises a switching part and a fixing part connected with each other, and the body comprises a first casing having a through slot, the fixing part is located in the first casing, wherein the switching part passes through the through slot and exposes to outside of the first casing, the through slot extends along a third direction that is perpendicular to the protruding direction of the switching part, the switching part is adapted to move along the through slot, such that the fixing part simultaneously contacts or departs away from the first rotating member and the second rotating member.

* * * * *